(12) United States Patent
Wiswell et al.

(10) Patent No.: US 7,449,892 B2
(45) Date of Patent: Nov. 11, 2008

(54) STRAY VOLTAGE DETECTING

(75) Inventors: Daniel C. Wiswell, Wakefield, MA (US);
Meredith P. Peterson, Burlington, MA (US); Jianping Sun, Selden, NY (US)

(73) Assignee: Cal-Tek 2000, Inc., North Billerica, MA (US)

( * ) Notice: Subject to any disclaimer, the term of this patent is extended or adjusted under 35 U.S.C. 154(b) by 15 days.

(21) Appl. No.: 11/421,927

(22) Filed: Jun. 2, 2006

(65) Prior Publication Data
US 2007/0279067 A1    Dec. 6, 2007

(51) Int. Cl.
G01R 29/12    (2006.01)
G01R 19/00    (2006.01)
G01R 31/28    (2006.01)

(52) U.S. Cl. .......................... 324/457; 324/67; 324/530
(58) Field of Classification Search .................. 324/67, 324/133, 457, 528, 530
See application file for complete search history.

(56) References Cited

U.S. PATENT DOCUMENTS

| | | | |
|---|---|---|---|
| 3,296,494 A | | 1/1967 | Stenger et al. |
| 3,624,503 A | | 11/1971 | Barrowcliff |
| 4,277,745 A | * | 7/1981 | Deno .......................... 324/457 |
| 4,686,475 A | * | 8/1987 | Kober et al. ................. 324/349 |
| 4,716,371 A | * | 12/1987 | Blitshteyn et al. ........... 324/457 |
| 4,724,393 A | * | 2/1988 | Kumada et al. .............. 324/458 |
| 4,853,617 A | * | 8/1989 | Douglas et al. ............... 324/67 |
| 4,884,034 A | | 11/1989 | Guzman |
| 4,992,741 A | * | 2/1991 | Douglas et al. ............... 324/67 |
| 5,027,108 A | | 6/1991 | Gray |
| 5,311,130 A | | 5/1994 | Bill et al. |
| 5,350,999 A | * | 9/1994 | Brunda ........................ 324/457 |
| 5,438,266 A | | 8/1995 | Tsang |
| 5,570,028 A | | 10/1996 | Sperlazzo et al. |
| 5,952,820 A | * | 9/1999 | Thrasher et al. ............. 324/133 |
| 5,995,588 A | | 11/1999 | Crick |
| 6,198,271 B1 | * | 3/2001 | Heger et al. .................... 324/67 |
| 6,242,911 B1 | * | 6/2001 | Maschek ........................ 324/72 |
| 6,249,130 B1 | * | 6/2001 | Greer .......................... 324/687 |
| 6,529,006 B1 | | 3/2003 | Hayes |
| 6,731,209 B2 | * | 5/2004 | Wadlow et al. ............. 324/686 |
| 6,788,215 B1 | * | 9/2004 | White ......................... 340/657 |
| 6,867,596 B1 | | 3/2005 | Mizuno |
| 6,995,670 B2 | * | 2/2006 | Wadlow et al. ............. 324/686 |
| 7,116,091 B2 | * | 10/2006 | Miller .......................... 324/67 |
| 7,136,765 B2 | * | 11/2006 | Maier et al. ................. 324/326 |

(Continued)

FOREIGN PATENT DOCUMENTS

EP        1069436 A1    1/2001

*Primary Examiner*—Timothy J Dole
(74) *Attorney, Agent, or Firm*—Fish & Richardson P.C.

(57) ABSTRACT

A stray voltage detector has a portable housing carrying a pair of electrostatic charge sensors spaced apart along an axis, and a pair of field intensity indicators, each indicator connected to an associated one of the charge sensors and constructed to indicate a relative electric field intensity at its associated sensor. The voltage detector is constructed to provide simultaneous electric field intensity feedback from both indicators to an operator moving the housing along the axis over a surface with a localized region at an elevated voltage, to assist in locating the localized elevated voltage region. The detector is useful for locating high-voltage regions, even when there is little or no current flowing through such regions to generate a magnetic field.

39 Claims, 5 Drawing Sheets

U.S. PATENT DOCUMENTS

| | | | |
|---|---|---|---|
| 7,141,968 B2 * | 11/2006 | Hibbs et al. | 324/686 |
| 7,141,987 B2 * | 11/2006 | Hibbs et al. | 324/457 |
| 7,161,486 B2 * | 1/2007 | Care | 324/109 |
| 7,248,054 B2 * | 7/2007 | Kalokitis et al. | 324/457 |
| 7,253,642 B2 * | 8/2007 | Kalokitis et al. | 324/457 |
| 2001/0010460 A1 * | 8/2001 | Miller et al. | 324/67 |
| 2004/0070535 A1 * | 4/2004 | Olsson et al. | 342/459 |
| 2005/0156600 A1 * | 7/2005 | Olsson et al. | 324/329 |

* cited by examiner

STRAY VOLTAGE DETECTING

TECHNICAL FIELD

This invention relates to electric field source detection, and more particularly to detection of electric fields emanating from stray mains voltages, such as from utility transmission faults.

BACKGROUND

Stray voltages from electric utility mains are known to be safety hazards in several urban environments, and have been known to injure or even kill animals stepping in electrified puddles on sidewalks or man-hole covers.

There is tremendous pressure on utility companies to quickly locate and correct the faults that lead to such stray voltages.

SUMMARY

According to one aspect of the invention, a stray voltage detector includes a housing carrying a pair of electrostatic charge sensors spaced apart along an axis, and a pair of field intensity indicators. Each indicator is operably connected to an associated one of the charge sensors and constructed to indicate a relative electric field intensity at its associated sensor. The voltage detector is constructed to provide simultaneous electric field intensity feedback from both indicators to an operator moving the housing along the axis over a surface with a localized region at an elevated voltage, to assist in locating the localized elevated voltage region.

In some embodiments, the electrostatic charge sensors each comprise a conductor positioned and configured to define a capacitor in cooperation with the localized elevated voltage region. The conductor may be in the form of a substantially flat plate, for example, having a thickness preferably less than about 0.005 inch (0.13 millimeter), such as about 0.001 inch (0.03 millimeter).

In some configurations, the conductor is a portion of a conductive layer of a printed circuit board.

In some cases the electrostatic charge sensors each comprise a plate of conductive material on a circuit board. For example, the plates may be formed by portions of an etched copper layer of the circuit board and electrically connected to electrical components on the circuit board through vias. In some embodiments, the circuit board includes a conductive shield trace extending between the electrostatic charge sensors and connected to an electrical ground potential. The conductive shield trace may extend about a major portion of a perimeter of at least one, or both, of the plates. In some cases, the shield trace lies directly between, and is coplanar with, the plates.

In some embodiments, the stray voltage detector includes a pair of amplifcation circuits, each amplification circuit having an input connected to a respective one of the electrostatic charge sensors. In some configuration each amplification circuit includes first and second amplification stages connected in series. Preferably one of the stages provides an adjustable gain, and each amplification circuit provides an overall effective gain of between about 1 and 10,000.

In some cases, the indicators are left and right audio speakers, and may be of a headset wearable by the operator, for example. In some configurations, the detector also includes a visual field intensity displays, each display operably connected to an associated one of the field sensors, such that the indicators and displays provide simultaneous left and right audio-visual feedback indicative of relative field intensity.

In some embodiments, the indicators are visual field intensity displays arranged to be viewed simultaneously by the operator. Each display may include a series of lights that sequentially illuminate with increasing field intensity or a single light that changes illumination intensity with field intensity. Other visual displays are also envisioned, such as liquid crystal displays or analog dial gages.

Preferably, the housing is hand-portable. The hosing may be elongated, with a lower end carrying the sensors laterally spaced apart, and an upper end having a handle graspable by the operator to move the lower end of the housing across the surface while walking erect along the surface. In some embodiments the handle is arranged to define a forward direction perpendicular to the axis along which the sensors are spaced apart, such that the sensors and their associated indicators comprise left and right sensor-indicator pairings. The left sensor-indicator pairing may include a left audio speaker operably connected to the sensor of the left sensor-indicator pairing, with the right sensor-indicator pairing including a right audio speaker operably connected to the sensor of the right sensor-indicator pairing, for example.

Some embodiments also include a global positioning system (GPS) receiver carried by the housing, with a display visible by the operator to indicate position of the stray voltage detector. The detector may also include a wireless transmitter operable to send a signal indicating detector position to a remote receiver.

The detector may also include stray voltage location memory storage contained within the housing, and which may be configured to time stamp stray voltage location data.

Some embodiments also include a data port disposed on the housing and connectavble to a data storage medium for storing stray voltage location data, and which may be configured to time stamp the stored stray voltage location data. In some cases the memory storage is configured to save sets of data, each set including an indication of test date and time, location latitude and longitude, and whether a stray voltage fault was detected.

Another aspect of the invention features a method of detecting stray mains voltage, such as by employing the above-described detector. According to one aspect, the method includes providing a portable detector with a housing carrying a pair of electrostatic charge sensors spaced apart along an axis, and a pair of field intensity indicators, each indicator operably connected to an associated one of the electrostatic charge sensors and constructed to indicate a relative electric field intensity at its associated sensor; moving the housing along the axis over a surface with a localized region at an elevated voltage, such that the elevated voltage region passes under a first, then a second of the pair of sensors, while monitoring the indicators, in response to the indicators indicating a shift in maximum field intensity from the first to the second sensor moving the housing back along the axis until the indicators indicate approximately an equal field intensity at the sensors; and recording housing position as a location of a stray mains voltage.

In some applications, the method also includes adjusting an amplification of a signal from one of the electrostatic charge sensors to its associated field intensity indicator, such as to squelch background signal noise.

In some embodiments, monitoring the indicators includes listening to left and right audio speakers, each speaker associated with a respective charge sensor.

In some cases, monitoring the indicators includes observing left and right visual indicators, each visual indicator associated with a respective charge sensor.

In some instances, recording housing position includes determining housing position by global satellite positioning and digitally recording the determined housing position in a memory storage. Some examples include wirelessly transmitting housing position to a remote receiver.

Various portable embodiments of the invention can simply electric field detection at least in part because they provide relative field intensity feedback along an axis between two spaced apart sensors connected to corresponding visual and/or audible intensity indicators, thus giving the operator stereo feedback means by which he or she can intuitively and readily position the detector at the precise location of the maximum stray voltage. Thus, operator training time is reduced and fault detection time is decreased. These embodiments with GPS capability can also provide the benefit of removing possible operator error in recording precise fault locations, and in some instances automatically report fault location to a central facility, such as by cellular phone connection. Robotic versions may even be employed to crawl urban streets and sideways at night and report precise fault locations, while sensors mounted to utility service vehicles or buses may detect stray voltages during normal operation.

Being responsive to electric field intensity, the detector can sense elevated voltages from electrical faults even when there is little or not current flowing at the fault. This is particularly advantageous in detecting stray voltages that can be found several feet from any flowing current, conducted by utility lines, manhole covers, or even rain water.

The details of one or more embodiments of the invention are set forth in the accompanying drawings and the description below. Other features, objects, and advantages of the invention will be apparent from he description and drawings, and from the claims.

DESCRIPTION OF DRAWINGS

Like reference symbols in the various drawings indicate like elements.

DETAILED DESCRIPTION

Figure 1:
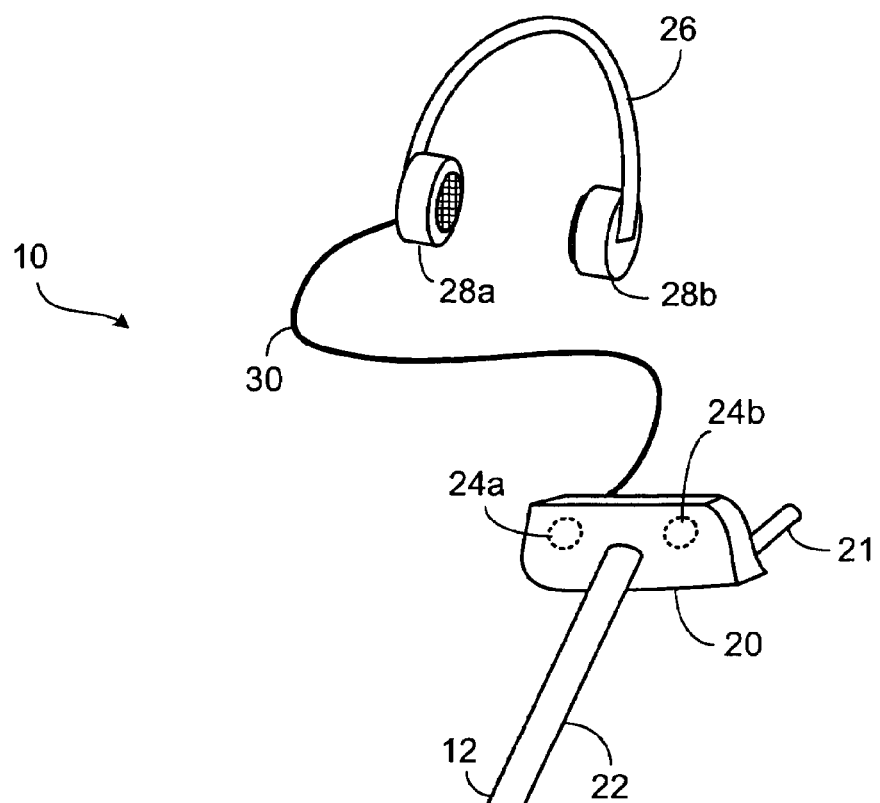
FIG. 1 is a perspective view of a stray voltage detector.
Figure 1:
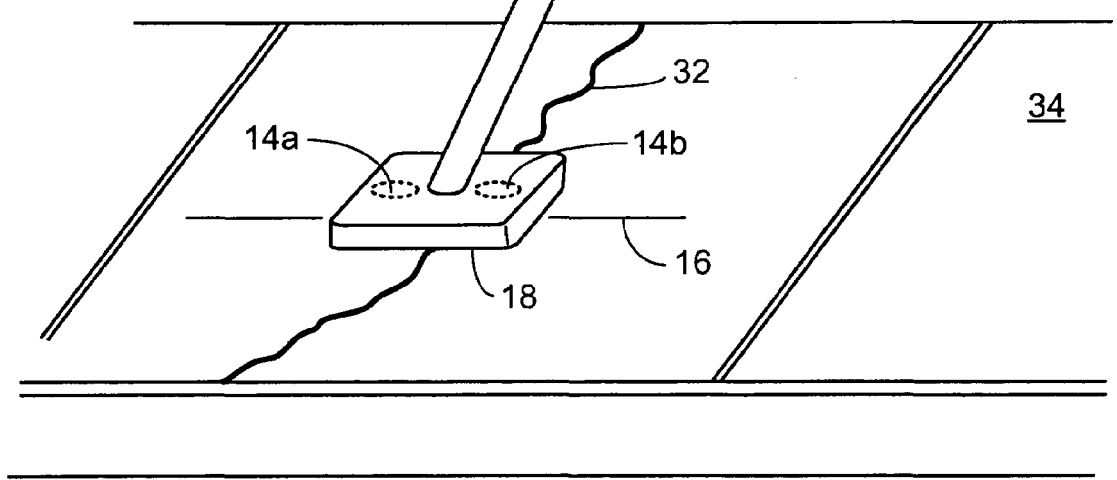

Referring to FIG. 1, a stray voltage detector 10 includes a portable housing 12 carrying a pair of electrostatic charge sensors 14a, 14b spaced apart along an axis 16 in a lower portion 18 of the housing. Mounted in an upper portion 20 of the housing, connected to lower portion 18 by an elongated tube 22, are a pair of field intensity visual indicators 24a, 24b. Visual indicator 24a is operably connected to charge sensor 14a, and visual indicator 24b is operably connected to charge sensor 14b, such as by electrical connections (not shown). Each visual indicator is constructed to visually indicate a relative electric field intensity at its associated sensor. Also included is a pair of headphones 26 with a right audio speaker 28a and a left audio speaker 28b. The headphones are electrically coupled to the housing by cord 30. Right audio speaker 28a forms an audible field intensity indicator operably connected to charge sensor 14a, and left audio speaker 28b forms an audible field intensity indicator operably connected to charge sensor 14b, such that each speaker is constructed to audible indicate a relative electric field intensity at its associated sensor.

Stray voltage detector 10 is shown detecting stray voltage associated with an electrical mains power fault in an urban environment. In this example, the stray voltage is conducted from the fault source along a moisture-bearing crack 32 and sidewalk 34, such that the crack represents a localized elevated voltage region in the plane of the sidewalk. As the detector housing is moved along axis 16 over the sidewalk surface by an operator supporting and moving the detector by grasping handle 21, visual indicators 24a, 24b provide simultaneous visual electric field intensity feedback from both charge sensors to the operator, assisting in determining the location of the elevated voltage region. At the same time, headphones 26 provide simultaneous left and right audible field intensity feedback to the operator, such that the operator receives both visual and audible indications of relative field intensity between the two sensors. By moving the detector back and forth across a narrow elevated voltage region, such as crack 32, the operator can sense, both audibly and visually, the relative movement of the voltage region with respect to the detector. Because the feedback is given in two separate indicators corresponding to left and right directions, rather than as just a changing light or tone intensity or volume, the effect is to provide an intuitively comprehensible indication of relative movement across the field source, such as stereo speakers can give an impression of the movement of a sound source. This results in a device that can be operated with little or no professional training, and under distracting conditions.

Figure 2:
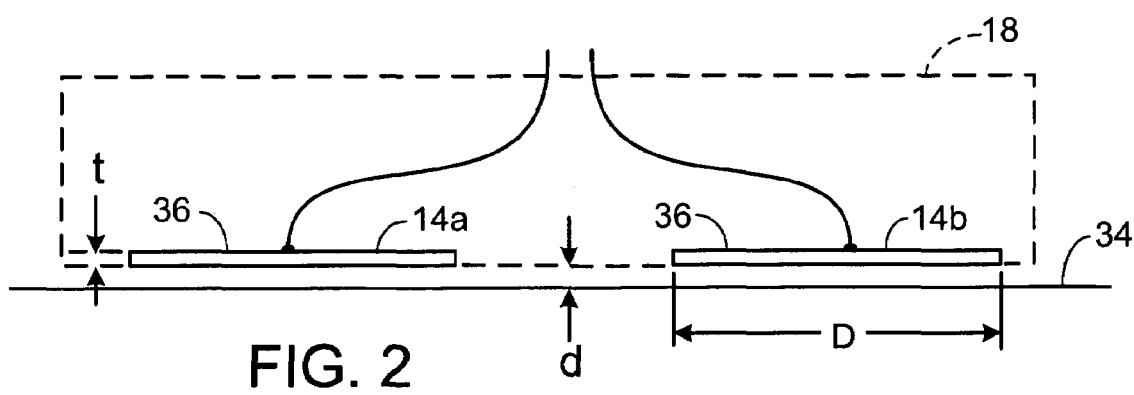
FIG. 2 is a cross-sectional view of the lower portion of the detector, showing the field sensors.

Referring to FIG. 2, electrostatic charge sensors 14a, 14b each include a conductive plate 36 of copper, having a flat plate thickness 't' of about 0.001 inch (0.013 mm) and a rectangular dimension of about 2 inches by 3 inches (50 by 75 mm), each having an exposed face at the lowermost extent of the lower housing portion 18. Other shapes are also envisioned, such as rounds plates or disks. Each plate 36 is thus positioned and configured to define a capacitor in cooperation with the localized elevated voltage region, as that plate is swept across the elevated voltage region. For example, the detector may be swept over the surface 34 of the sidewalk, with the exposed faces of the conductive plates 36 within a distance 'd' of only about one inch (25 mm), with the plates forming a sufficient capacitive coupling with the locally charged region of the sidewalk surface to detect such coupling and provide a suitable indication of field strength. As shown, the two plates 36 are spaced apart and electrically distinct. The outer faces of the plates are insulated by the housing to avoid conductive contact with the environment. Alternatively, the outer faces of the plates can be covered with a conformal coating to prevent conductive contact.

Figure 2A:
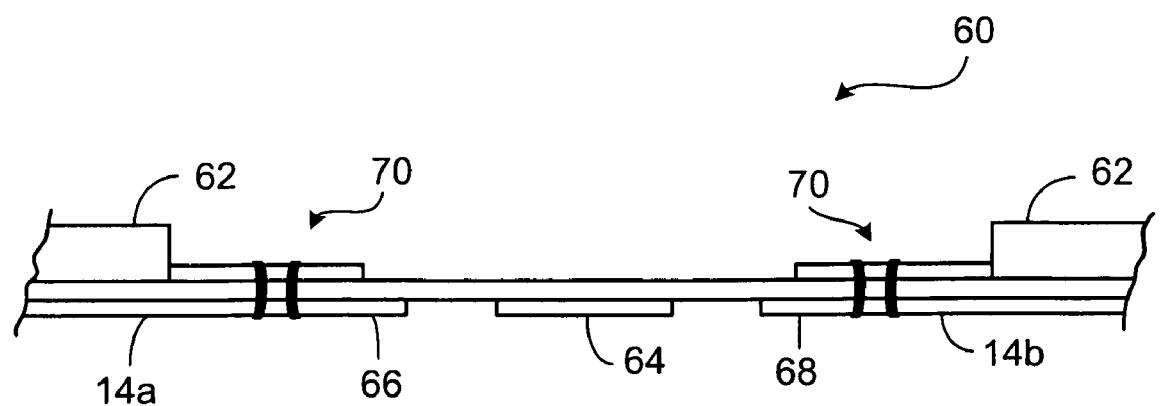
FIG. 2A is a cross-sectional view of an alternative embodiment, in which the field sensors are portions of a circuit board.
Figure 4:
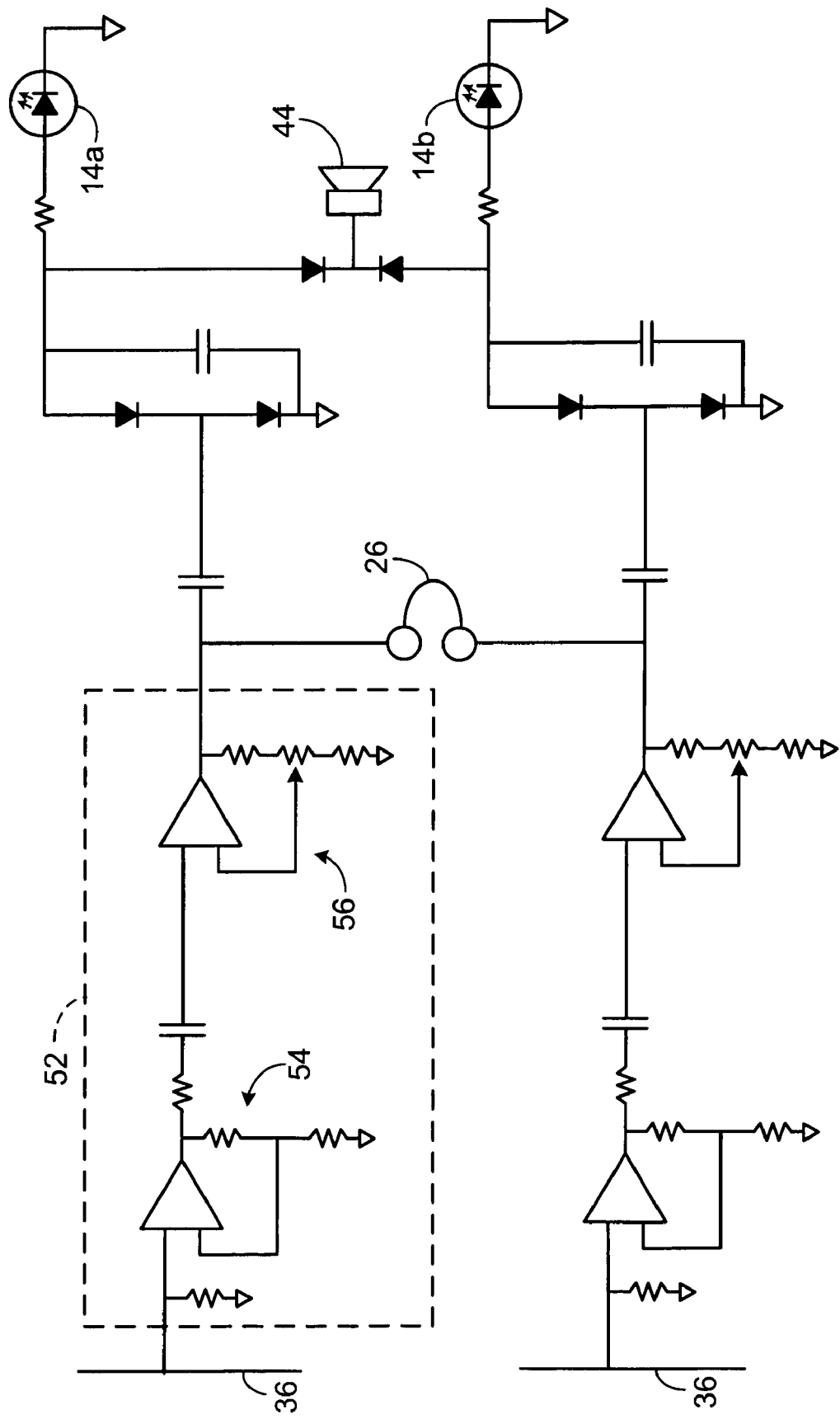
FIG. 4 is an electrical schematic of the detector.

Referring to FIG. 2A, circuit board 60 has an upper surface carrying a number of electronic components 62 forming the circuit shown in FIG. 4, and a lower surface carrying etched regions 66 and 68 of conductive copper that form the charge sensor plates. In this view only a small portion of the circuit board is shown, illustrating the inner edges of plates 14a and 14b, as well as a conducive shielding trace 64 running between and separating the plates and connected to a ground plane. Regions 66 and 68 are electrically connected to the rest of the circuit through vias 70 extending through the board.

Figure 2B:
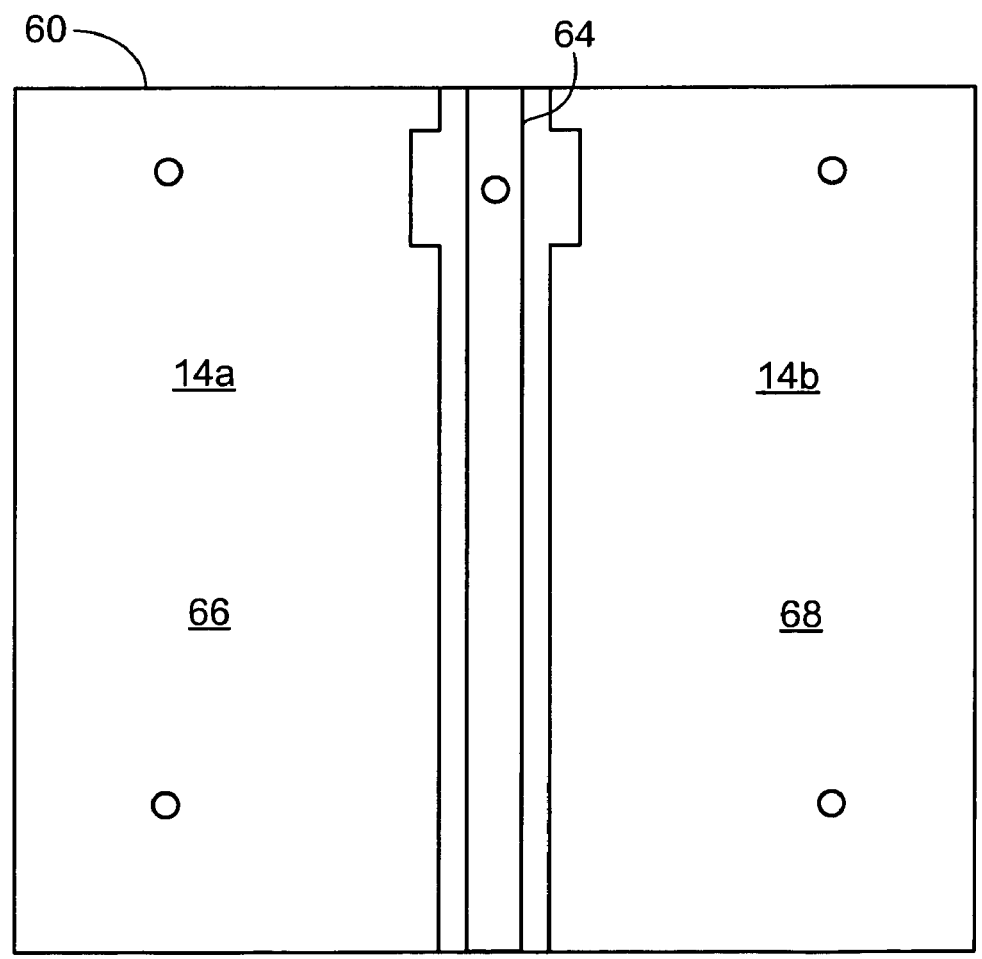
FIG. 2B is an underside view of the circuit board of FIG. 2A, showing the field sensors.

FIG. 2B illustrates a pattern of the etched copper regions forming the underside of board 60. These regions are formed by etching a single copper layer. As shown, shielding trace 64 extends between the adjacent edges of the sensor plates, but may also be configured to extend around a substantial portion of each plate. The shielding trace is coplanar with the two sensor plates and helps to eliminate any cross-talk between the two sensors. The holes shown extending through the two sensor plates and the shielding trace are for mounting hardware.

Figure 3:
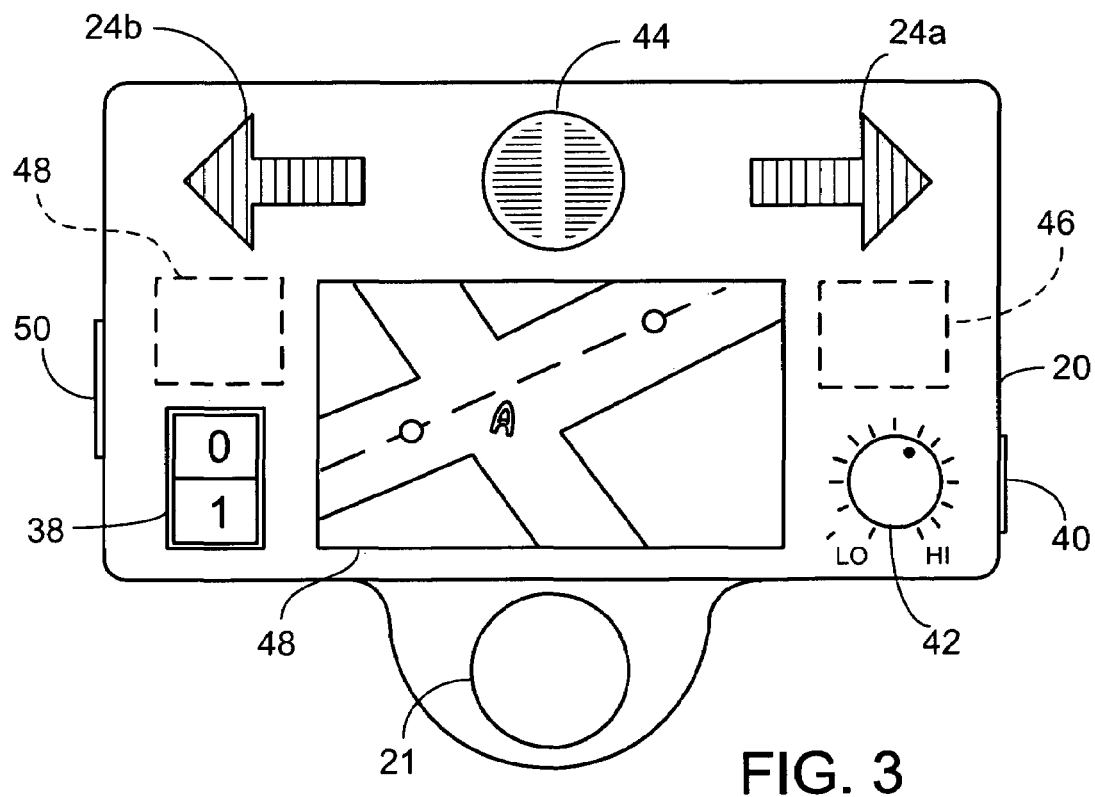
FIG. 3 is a dashboard schematic of the detector.

FIG. 3 shows the dashboard or indicator panel of the detector. Visual indicators 24a and 24b contain a series of light-emitting diode segments that sequentially illuminate with increasing field intensity and are arranged to be viewed simultaneously by the operator. Alternatively, each visual indicator may consist of a single LED that illuminates with an intensity that varies with field intensity. Also shown are a power switch 38, a headset jack 40, a headset volume control 42, and a fault detection buzzer 44 that provides an audible indication of the presence of elevated voltage in a headset-free mode. The upper portion 20 of the housing also contains a GPS antenna 46 that receives satellite signals and determines detector position. A touch screen 48 displays detector position with respect to the surrounding environment, such as from downloaded urban maps, and also provides a user interface for selecting various menu options for detector calibration, storing detected fault locations as time-stamped events in on-board memory 48 or downloading detected fault locations to a computing device or remote memory storage device (not shown) either connected to the detector at a data port 50 or via a wireless transmitter. Downloaded map information may include the location of buried utilities in addition to a road map, for example, and may also indicate a predetermined survey trail that an untrained operator is expected to traverse with the detector.

FIG. 4 is a basic stray voltage detector circuit diagram. Each electrostatic charge sensor conductive plate 36 is connected to an input of a respective amplification circuit 52 that consist of a first amplification stage 54 and a second, adjustable gain amplification stage 56, connected in series. The output of each amplification circuit 52 drives an associated headphone speaker and visual indicator. In this example, the first amplification stage 54 provides an effective gain of about 100, and the second amplification stage 56 provides an effective adjustable gain of about 1 to 100 resulting in an overall effective gain of about 100 to 10,000. Preferably, each amplification circuit 54 provides an overall effective gain of between about 1 and 10,000. The adjustability of at least the second amplification stage enables a operator to squelch background noise and interference, such as from background fields. Referring back to FIG. 1, the housing 12 of the detector is elongated, with a lower end carrying the sensors 14a, 14b laterally spaced apart, and an upper end having a handle 21 graspable by the operator to move the lower end of the housing across the surface 34 while walking erect along the surface. Handle 21 is arranged to define a forward direction perpendicular to the axis 16 along which the sensors are spaced apart, such that the sensors and their associated indicators comprise left and right sensor-indicator pairings. In use, the operator moves the housing along axis 16 over surface 34 with localized elevated voltage region 32, such that region 32 passes under a first, then a second of the pair of sensors, while monitoring visual indicators 24a, 24b and/or audible indicators 28a, 28b. In response to the indicators indicating a high maximum field intensity from the first to the second sensor, the operator moves the housing back along axis 16 until the indicators indicate approximately an equal field intensity at the sensors, and then records housing position as a location of a stray mains voltage.

Figure 5:
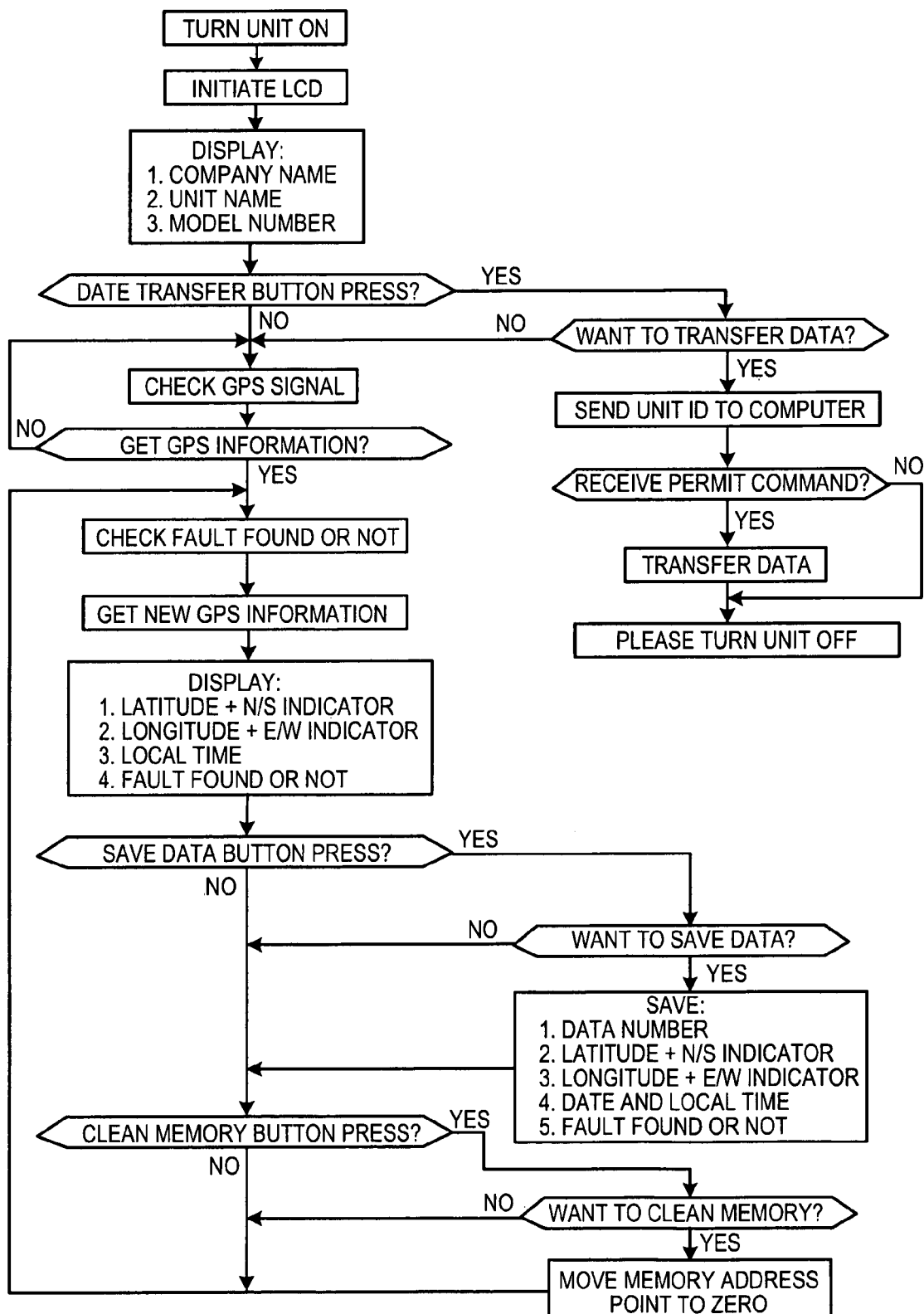
FIG. 5 illustrates an algorithm for displaying, transferring and saving fault data.

FIG. 5 illustrates a controller algorithm. In response to the pressing of a data transfer button, the algorithm branches to a data transfer process to transfer saved data to a remote computer, and then instructs the operator to power down the detector. In response to the pressing of a GPS button, the algorithm determines whether a fault is found, collects GPS location data, and displays the location and fault information on a screen for review by the operator. In further response to the pressing of a data save button, such data is saved in local memory. Local memory is cleared in response to the pressing of a clear memory button.

The above description is of a manually-transported and operated detector with a wide range of optional features. In its basic configuration, the detector consists essentially of two spaced-apart electric field sensors coupled to two spaced-apart field intensity indicators, such as visual or audible indicators. Additional spaced-apart sensors may be employed, such as to provide a two-dimensional indication of fault position. For example, an array of four sensors may be employed, with left-right intensity indicated audibly, and fore-aft intensity indicated visibly. Other configurations are also envisioned. The spaced-apart sensors and indicators can be mounted on a wheeled platform or vehicle, such as on a trunk with a pair of fore-aft sensors for indicating the passing of an elevated voltage region while an operator moves the truck across a road surface, such as by driving. Alternately, the detector may be mounted on a sidewalk-crawling robot that can be autonomously deployed to scour city sidewalks for faults at night (controlled either by a remote human operator or an on-board digital operator). The detector housing can be in the form of a wheeled push chassis, such as of the lawn mower type, with the sensors spaced apart in the fore-aft direction. In applications where the sensors are spaced relatively far apart, for example, computerized intensity interpolation methods may be employed to estimate fault location between the sensors.

A number of embodiments of the invention have been described. Nevertheless, it will be understood that various modifications may be made without departing from the spirit and scope of the invention. Accordingly, other embodiments are within the scope of the following claims.

What is claimed is:

1. A stray voltage detector comprising
   a housing carrying a pair of electrostatic charge sensors spaced apart along an axis;
   a pair of field intensity indicators, each indicator operably connected to an associated one of the charge sensors and constructed to indicate a relative electric field intensity at its associated sensor; and
   a conductive shield trace extending between the electrostatic charge sensors;
   the voltage detector thus being constructed to provide simultaneous electric field intensity feedback from both indicators to an operator moving the housing along the axis over a surface with a localized region at an elevated voltage, to assist in locating the localized elevated voltage region;
   wherein the electrostatic charge sensors each comprise a conductor positioned and configured to define a capacitor in cooperation with the localized elevated voltage region.

2. The stray voltage detector of claim 1 wherein the conductor comprises a substantially flat plate.

3. The stray voltage detector of claim 2 wherein the flat plate has a thickness of less than about 0.005 inch.

4. The stray voltage detector of claim 1 wherein the conductor comprises a portion of a conductive layer of a printed circuit board.

5. The stray voltage detector of claim 1 wherein the electrostatic charge sensors each comprise a plate of conductive material on a circuit board.

6. The stray voltage detector of claim 5 wherein the plates comprise portions of an etched copper layer of the circuit board.

7. The stray voltage detector of claim 6 wherein the plates are electrically connected to electrical components on the circuit board through vias.

8. The stray voltage detector of claim 5 wherein the conductive shield trace is connected to an electrical ground potential of the circuit board.

9. The stray voltage detector of claim 1 wherein the conductive shield trace lies directly between, and is coplanar with, the electrostatic charge sensors.

10. The stray voltage detector of claim 1 further comprising a pair of amplification circuits, each amplification circuit having an input connected to a respective one of the electrostatic charge sensors.

11. The stray voltage detector of claim 10 wherein each amplification circuit comprises first and second amplification stages connected in series.

12. The stray voltage detector of claim 11 wherein the second amplification stage provides an adjustable gain.

13. The stray voltage detector of claim 1 wherein the indicators comprise left and right audio speakers.

14. The stray voltage detector of claim 13 wherein the left and right audio speakers are of a headset wearable by the operator.

15. The stray voltage detector of claim 13 further comprising visual field intensity displays, each display operably connected to an associated one of the charge sensors, such that the indicators and displays provide simultaneous left and right audio-visual feedback indicative of relative field intensity.

16. The stray voltage detector of claim 1 wherein the indicators are visual field intensity displays arranged to be viewed simultaneously by the operator.

17. The stray voltage detector of claim 16 wherein the displays each comprise a series of lights that sequentially illuminate with increasing field intensity.

18. The stray voltage detector of claim 1 wherein the housing is hand-portable.

19. The stray voltage detector of claim 18 wherein the housing is elongated, with a lower end carrying the sensors laterally spaced apart, and an upper end having a handle graspable by the operator to move the lower end of the housing across the surface while walking erect on the surface.

20. The stray voltage detector of claim 19 wherein the handle is arranged to define a forward direction perpendicular to the axis along which the sensors are spaced apart, such that the sensors and their associated indicators comprise left and right sensor-indicator pairings.

21. The stray voltage detector of claim 20 wherein the left sensor-indicator pairing includes a left audio speaker operably connected to the sensor of the left sensor-indicator pairing, and wherein the right sensor-indicator pairing includes a right audio speaker operably connected to the sensor of the right sensor-indicator pairing.

22. The stray voltage detector of claim 1 further comprising a GPS receiver carried by the housing and having a display visible by the operator to indicate position of the stray voltage detector.

23. The stray voltage detector of claim 22 further comprising a wireless transmitter operable to send a signal indicating detector position to a remote receiver.

24. The stray voltage detector of claim 22 further comprising stray voltage location memory storage contained within the housing.

25. The stray voltage detector of claim 24 wherein the memory storage is configured to save sets of data, each set including an indication of test date and time, location latitude and longitude, and whether a stray voltage fault was detected.

26. The stray voltage detector of claim 1 further comprising a data port disposed on the housing and connectable to a data storage medium for storing stray voltage location data.

27. The stray voltage detector of claim 26 wherein the data storage medium is configured to time stamp stored stray voltage location data.

28. A method of detecting stray mains voltage, the method comprising providing a portable detector with a housing carrying a pair of electrostatic charge sensors spaced apart along an axis, and a pair of field intensity indicators, each indicator operably connected to an associated one of the electrostatic charge sensors and constructed to indicate a relative electric field intensity at its associated sensor;

moving the housing along the axis over a surface with a localized region at an elevated voltage, such that the elevated voltage region passes under a first, then a second of the pair of sensors, while monitoring the indicators;

in response to the indicators indicating a shift in maximum field intensity from the first to the second sensor, moving the housing back along the axis until the indicators indicate approximately an equal field intensity at the sensors; and recording housing position as a location of a stray mains voltage.

29. The method of claim 28 further comprising adjusting an amplification of a signal from one of the electrostatic charge sensors to its associated field intensity indicator.

30. The method of claim 28 wherein monitoring the indicators comprises listening to left and right audio speakers, each speaker associated with a respective charge sensor.

31. The method of claim 28 wherein monitoring the indicators comprises observing left and right visual indicators, each visual indicator associated with a respective charge sensor.

32. The method of claim 28 wherein the housing is moved by hand.

33. The method of claim 28 wherein recording housing position comprises determining housing position by global satellite positioning and digitally recording the determined housing position in a memory storage.

34. The method of claim 33 further comprising wirelessly transmitting housing position to a remote receiver.

35. A stray voltage detector responsive to a localized elevated voltage region of an exposed surface, the detector comprising a housing carrying a pair of electrostatic charge sensors spaced apart along an axis, each electrostatic charge sensor comprising a conductor positioned and configured to define a capacitor in cooperation with the localized elevated voltage region;

left and right audio speakers each operably connected to an associated one of the charge sensors and constructed to indicate a relative electric field intensity at its associated sensor; and left and right visual field intensity displays, each display operably connected to an associated one of the charge sensors, such that the indicators and displays provide simultaneous left and right audio-visual feedback indicative of relative field intensity;

the voltage detector thus being constructed to provide simultaneous electric field intensity feedback, from both the speakers and the displays, to an operator moving the housing along the axis over the exposed surface, to assist in locating the localized elevated voltage region.

36. The stray voltage detector of claim 35 wherein the left and right audio speakers are of a headset wearable by the operator.

37. A stray voltage detector responsive to a localized elevated voltage region of an exposed surface, the detector comprising a housing carrying a pair of electrostatic charge sensors spaced apart along an axis, each electrostatic charge sensor comprising a conductor positioned and configured to define a capacitor in cooperation with the localized elevated voltage region;

a pair of field intensity indicators, each indicator operably connected to an associated one of the charge sensors and constructed to indicate a relative electric field intensity at its associated sensor;

a GPS receiver carried by the housing; and stray voltage location memory storage contained within the housing and configured to store data indicative of determined positions of located stray voltages;

the voltage detector thus being constructed to provide simultaneous electric field intensity feedback from both field intensity indicators to an operator moving the housing along the axis over the exposed surface, to assist in locating the localized elevated voltage region, and to store voltage location data.

38. The stray voltage detector of claim 37 wherein the memory storage is configured to save sets of data, each set including an indication of test date and time, location latitude and longitude, and whether a stray voltage fault was detected.

39. The stray voltage detector of claim 37 further comprising a data port disposed on the housing and connectable to a data storage medium for storing stray voltage location data.

* * * * *